United States Patent [19]
Vaartstra

[11] Patent Number: 6,010,969
[45] Date of Patent: *Jan. 4, 2000

[54] METHOD OF DEPOSITING FILMS ON SEMICONDUCTOR DEVICES BY USING CARBOXYLATE COMPLEXES

[75] Inventor: Brian A. Vaartstra, Nampa, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/720,711

[22] Filed: Oct. 2, 1996

[51] Int. Cl.$^7$ ........................................................ B05D 3/08
[52] U.S. Cl. .............................. 438/758; 438/3; 438/240; 438/758; 438/754; 427/226; 427/96
[58] Field of Search ................................ 438/3, 240, 758, 438/754; 427/226, 96, 126.1, 126.3, 384

[56] References Cited

U.S. PATENT DOCUMENTS

| | | |
|---|---|---|
| 5,204,314 | 4/1993 | Kirlin et al. . |
| 5,225,561 | 7/1993 | Kirlin et al. . |
| 5,326,892 | 7/1994 | Vaartstra ................................. 556/28 |
| 5,401,535 | 3/1995 | Bishop ................................... 427/229 |
| 5,453,494 | 9/1995 | Kirlin et al. ............................. 534/15 |
| 5,536,323 | 7/1996 | Kirlin et al. . |
| 5,656,329 | 8/1997 | Hampden-Smith et al. ........... 427/226 |
| 5,677,002 | 10/1997 | Kirlin et al. . |
| 5,679,815 | 10/1997 | Kirlin et al. . |
| 5,695,815 | 12/1997 | Vaartstra ................................. 427/226 |
| 5,763,633 | 6/1998 | Vaartstra . |
| 5,820,664 | 10/1998 | Gardiner et al. . |

FOREIGN PATENT DOCUMENTS

| | | | |
|---|---|---|---|
| 0 405 634 A2 | 1/1991 | European Pat. Off. .......... | C07F 3/00 |
| WO 96/40690 | 12/1996 | WIPO . | |

OTHER PUBLICATIONS

J.M. Klerks et al., "I. Compounds of Aluminum: Cordination of Diazabutadienes to AL(CH$_3$)$_3$ and Subsequent Intramolecular Insertion and Rearrangement Reactions Leading to (CH$_3$ )$_2$ALR—N—CH(CH$_3$)—C(R')=N—R (R'=H, CH$_3$) and (CH$_3$)$_2$ALR—N—CH$_2$—C(CH$_3$)=N—R", *J. Organometallic Chem.*, 181 271–283 (1979), no month.

S.J. Troyanov et al., "Crystal and Molecular Structure of Bismuth(III) 2,2–Dimethylpropanoate", *J. Chem. Soc. Chem. Commun.*, 335–336 (1993), no month.

G. Van Koten et al., "Metal–1,4–diaza–1,3–butadiene Chemistry", *Adv. Organomet. Chem.*, 21, 222–225, 238–239 (1982), no month.

Versteeg et al., "Metalorganic Chemical Vapor Deposition by Pulsed Liquid Injection Using an Ultrasonic Nozzle: Titanium Dioxide on Sapphire from Titanium(IV) Isopropoxide", *J. Amer. Cer. Soc.*, 78, 2763–2768 (1995), no month.

*Primary Examiner*—Charles Bowers
*Assistant Examiner*—Thanh Nguyen
*Attorney, Agent, or Firm*—Mueting, Raasch & Gebhardt, P.A.

[57] ABSTRACT

A method of forming a film on a substrate using chemical vapor deposition techniques and carboxylate complexes. The complexes and method are particularly suitable for the preparation of semiconductor structures.

52 Claims, 2 Drawing Sheets

METHOD OF DEPOSITING FILMS ON SEMICONDUCTOR DEVICES BY USING CARBOXYLATE COMPLEXES

FIELD OF THE INVENTION

This invention relates to the preparation of semiconductor device structures, particularly to methods of depositing films, such as metal oxide films, using metal or metalloid carboxylate complexes.

BACKGROUND OD THE INVENTION

Capacitors are the basic energy storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs).

High quality thin oxide films of metals or metalloids, such as barium-strontium-titanates and strontium-bismuth-tantalates, for example, deposited on semiconductor wafers have recently gained interest for use in memories. These materials have very high dielectric constants and excellent resistance to fatigue. They also have suitable properties for a variety of other uses, such as electrooptic materials, pyroelectric materials, and antireflective coatings.

Suitable metal or metalloid oxides are typically delivered to a substrate in the vapor phase; however, many oxides are difficult to deliver using vapor deposition technology. Many precursors are sensitive to thermal decomposition. Also, many precursors have vapor pressures that are too low for effective vapor deposition. Thus, there is a continuing need for methods and materials for the deposition of oxide films using vapor deposition processes on semiconductor structures, particularly random access memory devices.

SUMMARY OF THE INVENTION

The present invention is directed to a method forming a film on a substrate, preferably of manufacturing a semiconductor structure, particularly a memory device. The method involves forming a film using a carboxylate complex. Typically and preferably, the film is a dielectric metal- or metalloid-containing material. The metal- or metalloid-containing film can be an oxide, sulfide, selenide, telluride, nitride, or combination thereof. Preferably, the film is a metal- or metalloid-containing oxide film. The film can be used as a dielectric layer in an integrated circuit structure, particularly in a memory device such as a ferroelectric memory device.

This method involves vaporizing a precursor, preferably a liquid precursor, comprising one or more carboxylate complexes and directing it toward a substrate, such as a semiconductor substrate or substrate assembly, using a chemical vapor deposition technique to form a metal- or metalloid-containing film on a surface of the substrate, wherein the carboxylate complex is of the following formula:

(Formula I)

or (Formula II)

wherein: M is a metal or metalloid; each R is H or an organic group; n+ is the valence oxidation state of the metal or metalloid (typically, 1 to 8); u=1 to n; v=0 to n−1; w=1 to 5; x=0 to 8; y=1 to 5; z=0 to 5; and u+v=n for Formula I or u+2v=n for Formula II. These carboxylate complexes are neutral complexes and may be liquids or solids. If they are solids, they are preferably sufficiently soluble in an organic solvent to allow for vaporization by flash vaporization, bubbling, microdroplet formation, etc.

This method is particularly well suited for forming films on a surface of a semiconductor substrate or substrate assembly, such as a silicon wafer, with or without layers or structures formed thereon, used in forming integrated circuits. It is to be understood that the method of the present invention is not limited to deposition on silicon wafers; rather, other types of wafers (e.g., gallium arsenide wafer, etc.) can be used as well. Also, the methods of the present invention can be used in silicon-on-insulator technology. Furthermore, substrates other than semiconductor substrates or substrate assemblies, can be used in the method of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

A particularly preferred embodiment of the present invention is a method of depositing a liquid precursor using a chemical vapor deposition involving microdroplet formation. The liquid precursor includes one or more carboxylate complexes of Formulas I or II, which may be liquids or solids dissolved in an organic solvent, for example. The method involves generating microdroplets of the liquid precursor; vaporizing the microdroplets using a heated carrier gas; and directing the vaporized microdroplets toward the substrate to form a film on the substrate.

Also, the present invention provides a chemical vapor deposition precursor comprising two or more carboxylate complexes of Formula I or Formula II above. One particularly preferred chemical vapor deposition precursor comprises: at least one compound of the formula (Formula III) $M^{n+}(OC(O)R^1)_u(OR^2)_v$ wherein M is a metal selected from the group consisting of Group IVB and Group VB, each R is H or an organic group, n=1 to 5, u=1 to n, and v=0 to n−1; and at least one compound of the formula (Formula IV) $M^{n+}(OC(O)R^1)_u\{(R^3)(R^4)N[(CH_2)_wN(R^5)]_x(CH_2)_yN(R^6)(R^7)\}_z$ wherein M is a meta or metalloid selected from the group consisting of Group IA, Group IIA, Group IIIA, Group IIIB, and the lanthanides, each R is H or an organic group, n=1 to 4, u=1 to n, w=1 to 5, x=0 to 8, y=1 to 5, and z=1 to 5.

DETAILED DESCRIPTION

The present invention provides a method of forming film (preferably, an oxide film) using one or more carboxylate complexes. Preferably, the carboxylate complexes are mononuclear (i.e., monomers) and display few intermolecular forces of attraction. Thus, they are preferably volatile (or sublimable) and transportable in the gas phase. They preferably have vapor pressures sufficiently low such that they are liquids at room temperature, although they can be solids. If they are solids, they are preferably soluble in organic solvents, such as aromatic and aliphatic hydrocarbons, nitrites, ethers, amines, etc., which allows for vaporization as a homogeneous mixture by direct liquid injection (although the solids can be sublimed in a chemical vapor deposition apparatus). They are also compatible with each other, so that mixtures of variable quantities of the complexes will not interact to significantly change their physical properties. Thus, they are suitable for use in chemical vapor deposition techniques, such as flash vaporization techniques, bubbler techniques, and the microdroplet techniques described in copending application entitled "Method and Apparatus for Vaporizing Liquid Precursors and System for Using Same," filed on even date herewith.

The method of the present invention involves vaporizing a precursor, preferably a liquid precursor, that includes one or more carboxylate complexes. The precursor can be vaporized in the presence of a gas, which can be inert (i.e., a carrier gas) or reactive with the carboxylate complex (i.e., a reaction gas), to form a film.

The carrier gas can be selected from a wide variety of gases that are unreactive with the carboxylate complexes described herein. Examples include nitrogen, helium, and argon. The reaction gas can be selected from a wide variety of gases reactive with the carboxylate complexes, at least at a substrate surface under the conditions of chemical vapor deposition. Examples of reaction gases include oxygen, nitrous oxide, ammonia, water vapor, hydrogen sulfide, hydrogen selenide, hydrogen telluride. Various combinations of carrier gases and/or reaction gases can be used in the methods of the present invention.

The resultant film therefore can be an oxide, sulfide, nitride, selenide, telluride, etc., or mixtures thereof. Preferably, the film formed is an oxide film. The film can be deposited in a wide variety of thicknesses, depending on the desired use. Preferably, the oxide film formed can be used as the dielectric material (e.g., ferroelectric material) between the plates (i.e., electrodes) in memory devices, such as ferroelectric memories.

The designation "carboxylate complex" refers to a metal or metalloid complex containing negatively charged carboxylate ligands formed from a carboxylic acid or substituted carboxylic acid. Any of a variety of carboxylate ligands can be present in the carboxylate complex as long as the complex can be used to form a film using chemical vaporization techniques. The carboxylate ligand stabilizes the metal/metalloid complex and can be tailored in the length of its hydrocarbon chain to yield desired solubility and viscosity characteristics. Examples of suitable carboxylate ligands include, but are not limited to, acetate, propionate, isobutyrate, and pivalate.

The carboxylate complex can also include other ligands, such as alkoxy groups, aryloxy groups, and polyamine groups. Particularly desirable are the polyamine groups (i.e., polyamine ligands). The polyamine ligands are sterically demanding. Thus, upon coordination to the metal or metalloid, they surround it, thereby reducing the amount of aggregation, which results in improved volatility. Thus, the polyamine ligands are preferred in the coordination sphere of the metal and metalloid complexes that are particularly difficult to vaporize.

Suitable carboxylate complexes have the following general formulas: $M^{n+}(OC(O)R_1)_u(OR^2)_v\{(R^3)(R^4)N[(CH_2)_wN(R^5)]_x(CH_2)_yN(R^6)(R^7)\}_z$ (Formula I) or $M^{n+}(OC(O)R_1)_u(O)_v\{(R^3)(R^4)N[(CH_2)_wN(R^5)]_x(CH_2)_yN(R^6)(R^7)\}_z$ (Formula II) wherein: M is a metal or metalloid; each R (i.e., $R^1$, $R^2$, $R^3$, $R^4$, $R^5$, $R^6$, and $R^7$) is H or an organic group (preferably, an organic group); n+ is the valence oxidation state of the metal or metalloid (preferably, 1 to 8); u=1 to n; v=0 to n−1; w=1 to 5; x=0 to 8 (preferably, 0 to 4); y=1 to 5; z=0 to 5 (preferably, 0 to 2); and u+v=n for Formula I or u+2v=n for Formula II. These complexes are monomers (i.e., mononuclear) in that they contain one metal or metalloid per molecule.

A preferred class of carboxylate complexes include those in which z=0. These carboxylate complexes are of the formula (Formula III):

wherein: M is a metal selected from the group consisting of Group IVB and Group VB; each R (i.e., $R^1$ and $R^2$) is H or an organic group (preferably, an organic group); n=1 to 5; u=1 to n; and v=0 to n−1.

Another preferred class of carboxylate complexes include those in which v=0. These carboxylate complexes are of the formula (Formula IV):

wherein: M is a metal or metalloid selected from the group consisting of Group IA (alkali metals), Group IIA (alkaline earth metals), Group IIIA, Group IIIB, and the lanthanides (preferably, M is a metal from Groups IA or IIA); each R ($R^1$, $R^2$, $R^3$, $R^4$, $R^5$, $R^6$, and $R^7$) is H or an organic group (preferably, an organic group); n=1 to 4; u=1 to n; w=1 to 5; x=0 to 8 (preferably, 0 to 4); y=1 to 5; and z=1 to 5 (preferably, 1 to 2).

Various combinations of the compounds described herein can be used in the precursor for chemical vapor deposition. Thus, as used herein, a "precursor" refers to a liquid or solid that includes one or more compounds of the formulas described herein. The precursor can also include one or more organic solvents suitable for use in a chemical vapor deposition system, as well as other additives, such as free ligands, that assist in the vaporization of the desired compounds.

As used herein, the term "organic group" means a hydrocarbon group that is classified as an aliphatic group, cyclic group, or combination of aliphatic and cyclic groups (e.g., alkaryl and aralkyl groups). In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

In metal- or metalloid-complexes such as this, substitution is not only tolerated, but is often advisable. Thus, substitution is anticipated in the complexes of the present invention. As a means of simplifying the discussion and the recitation of certain terminology used throughout this application, the terms "group" and "moiety" are used to differentiate between chemical species that allow for substitution or that may be substituted and those that do not so allow or may not be so substituted. Thus, when the term "group" is used to describe a chemical substituent, the described chemical material includes the unsubstituted group and that group with nonperoxidic O, N, or S atoms, for example, in the chain as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

For the $R^1$ and $R^2$ groups in the carboxylate complexes of the above formulas H or $(C_1-C_{30})$organic groups are preferred, H or $(C_1-C_{20})$organic groups are more preferred, and H or $(C_1-C_8)$organic groups are most preferred. Of the organic groups, nonaromatic groups (e.g., aliphatic groups and alicyclic groups, which may or may not include unsaturation, and which may or may not include heteroatoms such as N, O, S, P, Si, etc.) are preferred. Of these, the aliphatic groups are more preferred, and alkyl moieties are most preferred.

For the $R^3$, $R^4$, $R^5$, $R^6$, and $R^7$ groups of the polyamine ligands in the carboxylate complexes of the above formulas, which may be the same or different, H or $(C_1-C_{10})$organic groups are preferred, and H or $(C_1-C_5)$organic groups are more preferred. Of the organic groups, heteroatom-free groups (e.g., aromatic groups, aliphatic groups and alicyclic groups, which may or may not include unsaturation, but which do not include heteroatoms) are preferred. Of these, the aliphatic groups are more preferred, and alkyl moieties are most preferred.

In the carboxylate complexes of the above formulas, M refers to a metal or metalloid in the Periodic Table, including alkali metals (Group IA), alkaline earth metals (Group IIA), transition metals, lanthanides, actinides, as well as the metals and metalloids from Groups IIIA, IVA, VA, and VIA. For certain embodiments, M is a metal or metalloid of Groups IA, IIA, IIIA, IIIB, and lanthanides. For other embodiments, M is a metal or metalloid of Groups IVB and VB. Particularly preferred elements of M are Ba, Sr, Nb, Ta, Ti, and Bi.

The carboxylate complexes of the present invention can be prepared by a variety of methods known to one of skill in the art. For example, the carboxylate complexes containing polyamine ligands can be prepared by reacting a metal or metal alkoxide with carboxylic acid in the presence of a polyamine.

As stated above, the use of the carboxylate complexes and methods of forming oxide films of the present invention are beneficial for a wide variety of thin film applications in semiconductor structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

Figure 1:
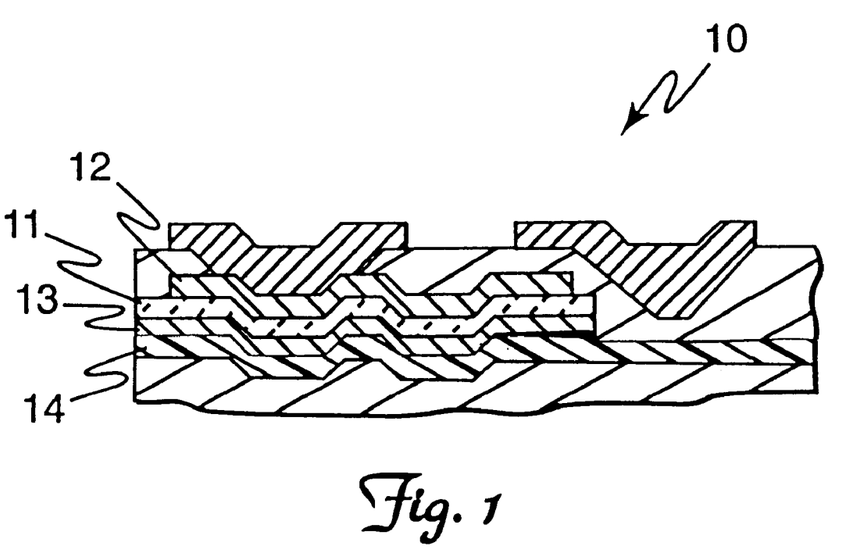
FIG. 1 is a cross-sectional schematic of a thin layer ferroelectric memory device having a ferroelectric oxide layer between the electrodes.

A specific example of where a film formed from the complexes of the present invention would be useful is the ferroelectric memory cell 10 of FIG. 1. The memory cell 10 includes a ferroelectric material 11, which is prepared by depositing one or more of the complexes discussed herein using chemical vapor techniques, between two electrodes 12 and 13, which are typically made of platinum, although other metals such as gold and aluminum can also be used. The bottom electrode 13 is typically in contact with a silicon-containing layer 14, such as an n-type or p-type silicon substrate, silicon dioxide, glass, etc.

The method of the present invention can be used to deposit a metal-or metalloid-containing film, preferably an oxide film, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The oxide film is deposited upon thermal decomposition of a carboxylate complex, preferably one that is either liquid at the temperature of deposition or soluble in a suitable solvent that is not detrimental to the substrate, other layers thereon, etc. In particularly preferred embodiments, however, solvents are not used; rather, the metal or metalloid carboxylate complexes are liquid and used neat. The method of the present invention utilizes standard vapor deposition techniques, such as flash vaporization, bubbling, etc.

Conventional bubbler technology can be used to form films from the carboxylate complexes described above. In conventional bubbler technology, a carrier gas, typically nitrogen, is bubbled through the precursor (which is either a liquid or is dissolved in a liquid solvent) to sweep some of the precursor molecules into the processing chamber.

Alternatives to conventional bubbler technology include an approach wherein the precursor is heated and vapors are drawn off and controlled by a vapor mass flow controller. Further, another way is to pump the gas through the precursor using either a very precise metering pump or a liquid mass flow controller up to the point where it enters the reaction chamber. At that point, it can either be flash vaporized or injected directly into a mixing chamber and showerhead where it is vaporized. As described in the article entitled, "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995) a metalorganic CVD process utilizes pulsed on/off liquid injection in conjunction with atomization by an ultrasonic, piezoelectrically driven nozzle to deliver such metalorganic precursors. The pulse injection is said to allow control of film deposition rates, as fine as monolayers per pulse. The ultrasonic nozzle provides a mist of droplets into the processing chamber of a reactor for reproducible vaporization of the liquid precursor. Such a delivery system performs the vaporization in the processing chamber.

The carboxylate complexes described herein are particularly well suited for use with vapor deposition systems, as described in copending application U.S. Ser. No. 08/720,710 entitled "Method and Apparatus for Vaporizing Liquid Precursors and System for Using Same," filed on even date herewith.

Generally, using the method described therein, the vaporization of a liquid precursor or precursor dissolved in a liquid medium is carried out in two stages. First, the precursor is atomized or nebulized generating high surface area microdroplets or mist. In the second stage, the constituents of the microdroplets or mist are vaporized by intimate mixture of the heated carrier gas. This two stage vaporization approach provides a reproducible delivery for precursors (either liquid or dissolved in a liquid medium) and provides reasonable growth rates, particularly in device applications with small dimensions.

Figure 2:
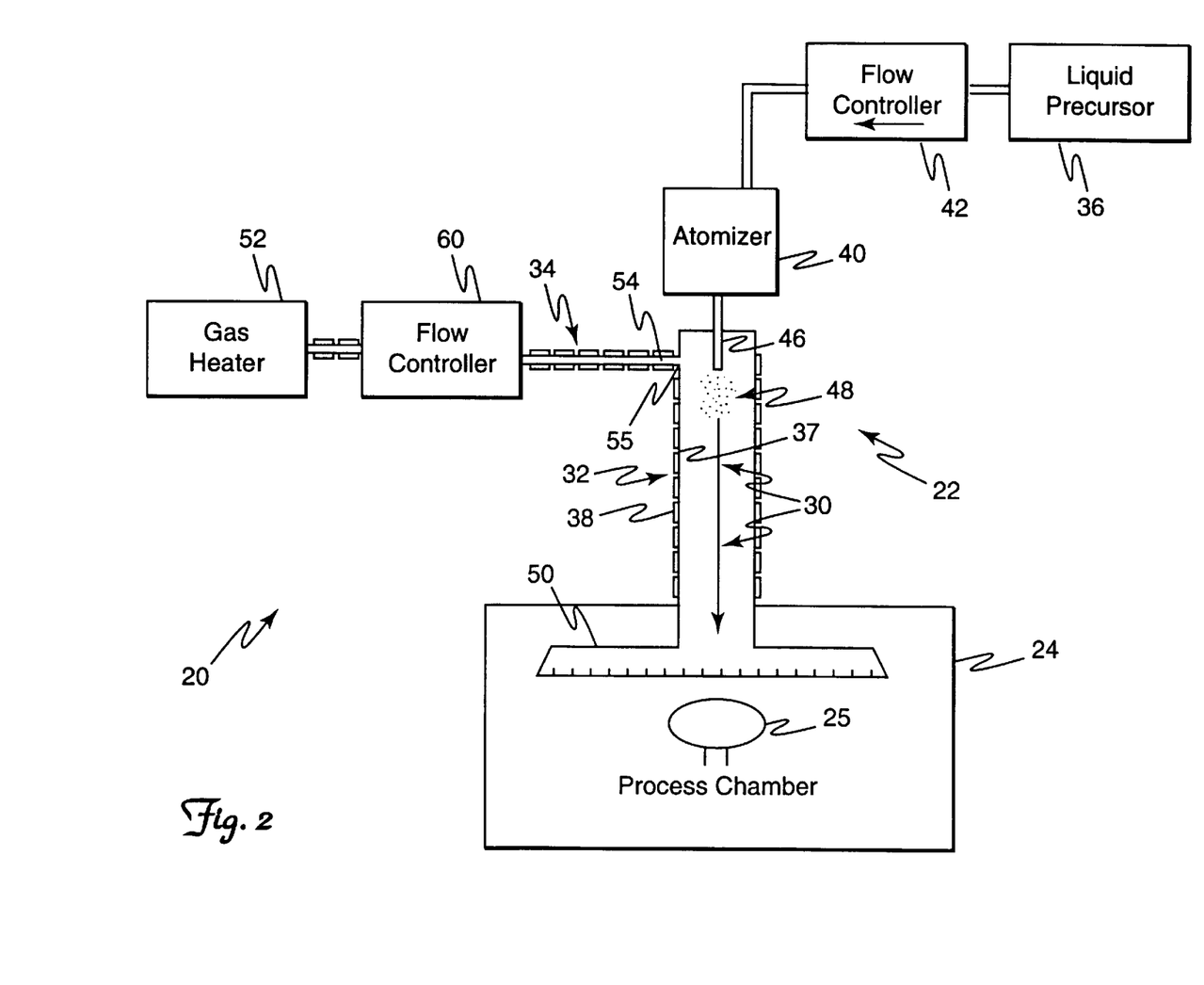
FIG. 2 is a perspective view of a chemical vapor deposition coating apparatus suitable for use in the method of the present invention.

As shown in FIG. 2, vapor deposition system 20 includes the CVD precursor vaporizer 22 and process chamber or reaction chamber 24. The CVD precursor vaporizer 22 includes a heated vaporization zone 30 defined by housing 32. The heated vaporization zone 30 includes a vapor flow path from a microdroplet generating device or atomizer 40 to the process chamber 24. The heated housing 32 includes at one end a directing device 50 for directing the vaporized liquid precursor into the process chamber 24. The directing device may include any known means of directing the vaporized liquid precursor from the vapor flow path into the process chamber 24 for deposition on a substrate, such as wafer 25. As shown in FIG. 2, directing device 50 includes a showerhead.

The microdroplet generating device or atomizer 40 generates high surface area microdroplets, for example, droplets of approximately 20 micrometers in diameter (although, generally, microdroplets may be defined as any droplet having a mean diameter less than about 1000 micrometers in diameter). The atomizer 40 may include an ultrasonic nebulizer such as that available from Sono-Tek Corp., Poughkeepsie, New York or Sonics & Materials, Inc., Danbury, Conn. The ultrasonic nebulizer, as is known to one skilled in the art, includes, for example, a nozzle 36 containing piezoelectric transducers that create standing vibrations along the nozzle body to generate droplets or mist for dispensing through a tip of a nozzle.

Alternatively, the atomizer 40 may include an electrostatic sprayer, such as that available from Binks, Franklin Park, Ill. The electrostatic sprayer as is known to one of skill in the art, generates the droplets for dispensing into the vaporization zone using electrostatic charge to separate the liquid precursor into droplets. Further, the mist or microdroplets may also be created utilizing a forced gas, or in other words, a bubbler that produces the fine mist of microdroplets utilizing a series of baffles to obtain the high surface area microdroplet.

The atomizer 40 is provided with a liquid precursor by a flow controller or liquid pump 42. Any flow controller, such as, for example, commonly available mass flow controllers, that provide a flow of liquid precursor to the atomizer 40 in a reproducible fashion may be utilized.

The nozzle 46 of atomizer 40 is sealingly positioned with its open end tip extending into the vaporization zone 30. The nozzle 46 may be in a fixed position or its position may be variable for movement within the vaporization zone 30. Such a variably positioned nozzle may be utilized to change the length of the vapor flow path in order to decrease or lengthen the residence time of the microdroplets or mist 48 in the vaporization zone 30.

The microdroplets are flash vaporized by contacting them with a heated carrier gas 54 (e.g., helium, nitrogen, argon). Heated carrier gas 54 is provided to the heated vaporization zone 30 through port 55 and by way of a heated gas line 34. The heated gas line 34 includes heating elements 38 for heating the gas. The gas is heated by a gas heater 52 and the flow of the heated gas is controlled by flow controller 60. Flow controller may be any flow controller, such as, for example, commonly available mass flow controllers, that provide a flow of gas to the vaporization zone in a reproducible fashion where it is intimately mixed with the microdroplets 48 from atomizer 40.

The heated carrier gas is of a temperature so as to be the primary source of heat required for vaporizing the microdroplets 48. For example, depending on the necessary heat required for vaporizing the microdroplets, the gas may be of a temperature in the range of about −10°C. to about 500° C., preferably about 30° C. to about 250° C. The temperature of the heated carrier gas will also vary depending on the temperature of the liquid precursor which will typically vary from about 10° C. to about 100° C., and any other applicable vaporization process parameters, such as flow rates, etc.

The microdroplets 48 will come into contact with the heated carrier gas 54 for flash vaporization by the heated carrier gas 54 in the vaporization zone 30. Every microdroplet should be in intimate contact with the heated carrier gas 54 for instantaneous heating and vaporization thereof. The vaporization zone 30 allows for sufficient residence time to complete vaporization before the components of the liquid precursor 36 are carried into the CVD process chamber 24.

The heated housing 32 defines the heated vaporization zone 30 and includes walls 37 heated by heating elements 38 to maintain the temperature of the carrier gas and the liquid precursor microdroplet mixture to a temperature that deters condensation of the liquid precursor on the walls 37 of the heated housing 32. The heated vaporization zone 30 is controlled to maintain a substantially constant temperature along the vapor flow path extending from the atomizer to the process chamber.

Further, flow rate of the heated carrier gas 54 is controlled by the flow controller 60 so as to provide a sufficient flow rate to also keep the precursor from decomposing on the walls 37 of the heated housing 32. The flow rate of the heated carrier gas 54 under the control of flow controller 60 also provides control of the residence time of the microdroplets within the heated vaporization zone 30.

Various combinations of carrier gases and/or reaction gases can be used in the methods of the present invention. They can be introduced into the chemical vapor deposition chamber in a variety of manners, such as directly into the vaporization chamber, in combination with the precursor, in combination (or in place of) the carrier gas.

Although a specific vapor deposition process is described by reference to FIG. 2, the method of the present invention is not limited to being used with the specific vapor deposition apparatus shown. Various CVD process chambers or reaction chambers can be used, including hot wall or cold wall reactors, atmospheric or reduced pressure reactors, as well as plasma enhanced reactors. Furthermore, the method of the present invention is not limited to any specific vapor deposition technique.

The following examples are offered to further illustrate the various specific and preferred embodiments and techniques. It should be understood, however, that many variations and modifications may be made while remaining within the scope of the present invention.

EXAMPLES

Example 1: Preparation of $Sr[O_2CC(CH_3)_3]_2[(CH_3)_2NCH_2CH_2N(CH_3)CH_2CH_2N(CH_3)_2]$ A flask is charged with 8.76 g (0.1 mol) of strontium granules in an inert atmosphere. To this is added 200 mL of diethyl ether (anhydrous) and 17.3 g (0.1 mol) of N,N,N',N',N"-pentamethyl diethylenetriamine. The strontium is then oxidized by slow addition of 20.42 g (0.2 mol) of trimethylacetic acid. Evolution of dihydrogen is observed during addition of the acid. The strontium is allowed to be completely consumed by stirring for 18 hours. The product is then purified by crystallization by removing most of the diethyl ether in vacuo, cooling the flask, and filtering the colorless crystalline solid.

Example 2: Preparation of $Bi[O_2CC(CH_3)_3]_3$

The compound is prepared as described in S. J. Troyanov et al., *J. Chem. Soc. Chem. Commun.*, 335 (1993).

Example 3: Preparation of $Ta[O_2CC(CH_3)_3]_5$

A flask is charged with 10.0 g (0.025 mol) of tantalum(V) ethoxide in an inert atmosphere, and the flask equipped with a distillation head. To this is added 100 mL of pentane (anhydrous). The resulting solution is then reacted with 12.57 g (0.123 mol) of trimethylacetic acid. After the reaction is complete, the ethanol byproduct is removed by distilling off 50 mL of solvent. The product is then collected by filtration and dried in vacuo.

Example 4: Preparation of $SrBi_2Ta_2O_9$ Ferroelectric Thin Film

A patterned semiconductor wafer is loaded into a CVD chamber and heated to 600° C. A precursor solution is prepared by dissolving 1 part $Sr[O_2CC(CH_3)_3]_2[(CH_3)_2NCH_2CH_2N(CH_3)CH_2CH_2N(CH_3)_2]$, 2 parts $Bi[O_2CC(CH_3)_3]_3$, and 2 parts $Ta[O_2CC(CH_3)_3]_5$ in heptane, with addition of 1 part N,N,N'N'N"-pentamethyldiethylenetriamine for assistance in stabilizing the strontium complex. This solution is introduced into the process chamber as a vapor, using the apparatus shown in FIG. 2. Input carrier gas is preheated to 190° C. using a flow of 100 sccm. Oxygen is added to the process chamber by means of another inlet at a flow rate of 400 sccm. The deposition is carried out until a desired $SrBi_2Ta_2O_9$ film thickness is obtained on the wafer.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of manufacturing a semiconductor structure comprising:

providing a semiconductor substrate or substrate assembly;

providing a precursor comprising at least one carboxylate complex having a formula selected from the group of:

$M^{n+}(OC(O)R^1)_u(OR^2)_v\{(R^3)(R^4)N[(CH_2)_wN(R^5)]_x(CH_2)_yN(R^6)(R^7)\}_z$ (Formula I), $M^{n+}(OC(O)R^1)_u(O)_v\{(R^3)(R^4)N[(CH_2)_wN(R^5)]_x(CH_2)_yN(R^6)(R^7)\}_z$ (Formula II), and combinations thereof, wherein:
   M is a metal or metalloid;
   each R is H or an organic group;
   n+ is the valence oxidation state of the metal or metalloid;
   u=1 to n;
   v=0 to n−1;
   w=1 to 5;
   x=0 to 8;
   y=1 to 5;
   z=0 to 5; and
   u+v=n for Formula I or u+2v=n for Formula II;
   with the proviso that at least one carboxylate complex has a formula wherein
   z=1 to 5; and
   vaporizing the precursor and directing it toward the semiconductor substrate or substrate assembly using a chemical vapor deposition technique to form a film on a surface of the semiconductor substrate or substrate assembly.

2. The method of claim 1 wherein the precursor is vaporized in the presence of a carrier gas.

3. The method of claim 2 wherein the precursor is vaporized in the presence of a reaction gas.

4. The method of claim 3 wherein:
   the carrier gas is selected from the group consisting of nitrogen, helium, argon, and mixtures thereof, and
   the reaction gas is selected from the group consisting of oxygen, nitrous oxide, ammonia, water vapor, hydrogen sulfide, hydrogen selenide, hydrogen telluride, and mixtures thereof.

5. The method of claim 4 wherein the film is a film of an oxide, sulfide, nitride, selenide, telluride, or mixture thereof.

6. The method of claim 1 wherein the film is an oxide film and forms a dielectric layer.

7. The method of claim 1 wherein the precursor is a liquid precursor.

8. The method of claim 7 wherein the chemical vapor deposition technique comprises flash vaporization, bubbling, microdroplet formation, or combinations thereof.

9. The method of claim 1 wherein M is selected from the group consisting of Group IA, Group IIA, Group IIIA, Group IIIB, Group IVB, Group VA, Group VB, and the lanthanides.

10. The method of claim 1 wherein x=0 to 4 and z=0 to 2.

11. The method of claim 1 wherein n+=1 to 8.

12. The method of claim 1 wherein each $R^1$ and $R^2$ group is independently H or a $(C_1$–$C_{30})$organic group.

13. The method of claim 1 wherein each $R^3$, $R^4$, $R^5$, $R^6$, and $R^7$ group is independently H or a $(C_1$–$C_{10})$organic group.

14. The method of claim 13 wherein each organic group is a heteroatom-free organic group.

15. The method of claim 1 wherein the precursor comprises a carboxylate complex of the formula (Formula III):

$M^{n+}(OC(O)R^1)_u(OR^2)_v$ wherein:
M is a metal selected from the group consisting of Group IVB and Group VB;
each R is H or an organic group;

n=1 to 5;
u=1 to n; and
v=0 to n−1.

16. The method of claim 1 wherein the precursor comprises a carboxylate complex of the formula (Formula IV):

wherein:
M is a metal or metalloid selected from the group consisting of Group IA, Group IIA, Group IIIA, Group IIIB, and the lanthanides;
each R is 1a1 or an organic group;
n=1 to 4;
u=1 to n;
w=1 to 5;
x=0 to 8;
y=1 to 5; and
z=1 to 5.

17. A method of manufacturing a memory device structure comprising: providing a substrate having a first electrode thereon; providing a precursor comprising at least one carboxylate complex having a formula selected from the group of:

(Formula I), (Formula II), and combinations thereof,
wherein:
M is a metal or metalloid;
each R is H or an organic group;
n+ is the valence oxidation state of the metal or metalloid;
u=1 to n;
v=0 to n−1;
w=1 to 5;
x=0 to 8;
y=1 to 5;
z=0 to 5; and
u+v=n for Formula I or u+2v=n for Formula II;
with the proviso that at least one carboxylate complex has a formula wherein
z=1 to 5; and
forming a first electrode on the substrate; vaporizing the precursor and directing it toward the substrate using a chemical vapor deposition technique to form a dielectric layer comprising an oxide film on the first electrode of the substrate; and
forming a second electrode on the dielectric layer.

18. The method of claim 17 wherein the substrate is a silicon wafer.

19. The method of claim 17 wherein the oxide film forms a ferroelectric layer.

20. The method of claim 17 wherein M is selected from the group consisting of Group IA, Group IIA, Group IIIA, Group IIIB, Group IVB, Group VA, Group VB, and the lanthanides.

21. The method of claim 20 wherein M is selected from the group consisting of Ba, Sr, Nb, Ta, Ti, and Bi.

22. The method of claim 17 wherein x=0 to 4 and z=0 to 2.

23. The method of claim 17 wherein n+=1 to 8.

24. The method of claim 17 wherein each $R^1$ and $R^2$ group is independently H or a ($C_1$–$C_{30}$)organic group.

25. The method of claim 24 wherein each organic group is a nonaromatic group.

26. The method of claim 17 wherein each $R^3$, $R^4$, $R^5$, $R^6$, and $R^7$ group is independently H or a ($C_1$–$C_{10}$)organic group.

27. The method of claim 26 wherein each group organic group is a heteroatom-free organic group.

28. The method of claim 17 wherein the precursor comprises a carboxylate complex of the formula (Formula III):

wherein:
M is a metal selected from the group consisting of Group IVB and Group VB;
each R is H or an organic group;
n=1 to 5;
u=1 to n; and
v=0 to n−1.

29. The method of claim 17 wherein the precursor comprises a carboxylate complex of the formula (Formula IV):

wherein:
M is a metal or metalloid selected from the group consisting of Group IA, Group IIA, Group IIIA, Group IIIB, and the lanthanides;
each R is H or an organic group;
n=1 to 4;
u=1 to n;
w=1 to 5;
x=0 to 8;
y=1 to 5; and
z=1 to 5.

30. The method of claim 17 wherein the precursor is a liquid precursor which is vaporized in the presence of a carrier gas.

31. The method of claim 30 wherein the precursor is vaporized in the presence of a reaction gas.

32. The method of claim 31 wherein:
the carrier gas is selected from the group consisting of nitrogen, helium, argon, and mixtures thereof; and
the reaction gas is selected from the group consisting of oxygen, nitrous oxide, ammonia, water vapor, hydrogen sulfide, hydrogen selenide, hydrogen telluride, and mixtures thereof.

33. A method of forming a film on a substrate comprising:
providing a substrate;
providing a precursor comprising at least one carboxylate complex having a formula selected from the group of:

(Formula I), (Formula II), and combinations thereof,
wherein:
M is a metal or metalloid;
each R is H or an organic group;
n+ is the valence oxidation state of the metal or metalloid;

u=1 to n;
v=0 to n−1;
w=1 to 5;
x=0 to 8;
y=1 to 5;
z=0 to 5; and
u+v=n for Formula I or u+2v=n for Formula II;
with the proviso that at least one carboxylate complex has a formula wherein
z=1 to 5, and
vaporizing the precursor and directing it toward the substrate using a chemical vapor deposition technique to form a film on the substrate.

34. The method of claim 33 wherein the precursor is vaporized in the presence of a carrier gas.

35. The method of claim 34 wherein the precursor is vaporized in the presence of a reaction gas.

36. The method of claim 35 wherein:
the carrier gas is selected from the group consisting of nitrogen, helium, argon, and mixtures thereof, and
the reaction gas is selected from the group consisting of oxygen, nitrous oxide, ammonia, water vapor, hydrogen sulfide, hydrogen selenide, hydrogen telluride, and mixtures thereof.

37. The method of claim 36 wherein the film is a film of an oxide, sulfide, nitride, selenide, telluride, or mixture thereof.

38. The method of claim 37 wherein the film is an oxide film.

39. The method of claim 38 wherein the oxide film forms a ferroelectric layer in a ferroelectric memory device.

40. The method of claim 33 wherein the substrate comprises a silicon substrate.

41. The method of claim 33 wherein the precursor is a liquid precursor and the step of vaporizing comprises flash vaporization, bubbling, microdroplet formation, or combinations thereof.

42. The method of claim 33 wherein M is selected from the group consisting of Group IA, Group IIA, Group IIIA, Group IIIB, Group IVB, Group VA, Group VB, and the lanthanides.

43. The method of claim 33 wherein x=0 to 4 and z=0 to 2.

44. The method of claim 33 wherein n+=1 to 8.

45. The method of claim 33 wherein each $R^1$ and $R^2$ group is independently H or a ($C_1$–$C_{30}$)organic group.

46. The method of claim 45 wherein each $R^1$ and $R^2$ group is independently H or a ($C_1$–$C_{30}$)aliphatic group.

47. The method of claim 46 wherein each $R^1$ and $R^2$ group is independently H or a ($C_1$–$C_8$)alkyl moiety.

48. The method of claim 33 wherein each $R^3$, $R^4$, $R^5$, $R^6$, and $R^7$ group is independently H or a ($C_1$–$C_{10}$)aliphatic group.

49. The method of claim 46 wherein each $R^3$, $R^4$, $R^5$, $R^6$, and $R^7$ group is independently H or a ($C_1$–$C_5$)alkyl moiety.

50. The method of claim 33 wherein the precursor comprises a carboxylate complex of the formula (Formula III):

wherein:
M is a metal selected from the group consisting of Group IVB and Group VB;
each R is H or an organic group;
n=1 to 5;
u=1 to n; and
v=0 to n−1.

51. The method of claim 33 wherein the precursor comprises a carboxylate complex of the formula (Formula IV):

wherein:
M is a metal or metalloid selected from the group consisting of Group IA, Group IIA, Group IIIA, Group IIIB, and the lanthanides;
each R is H or an organic group;
n=1 to 4;
u=1 to n;
w=1 to 5;
x=0 to 8;
y=1 to 5; and
z=1 to 5.

52. A method of forming a film on a substrate comprising:
providing a substrate;
providing a liquid precursor comprising at least one carboxylate complex having a formula selected from the group of:

(Formula I), (Formula II), and combinations thereof,
wherein:
M is a metal or metalloid;
each R is H or an organic group;
n+ is the valence oxidation state of the metal or metalloid;
u=1 to n;
v=0 to n−1;
w=1 to 5;
x=0 to 8;
y=1 to 5;
z=0 to 5; and
u+v=n for Formula I or u+2v=n for Formula II;
with the proviso that at least one carboxylate complex has a formula wherein
z=1 to 5; and
generating microdroplets of the liquid precursor;
vaporizing the microdroplets using a heated carrier gas; and
directing the vaporized microdroplets toward the substrate to form a film on the substrate.

* * * * *

UNITED STATES PATENT AND TRADEMARK OFFICE
CERTIFICATE OF CORRECTION

PATENT NO.    : 6,010,969
DATED         : January 4, 2000
INVENTOR(S)   : Brian A. Vaartstra It is certified that error appears in the above-identified patent and that said Letters Patent is hereby corrected as shown below:

Title page, Item [54], and Column 1, lines 1 and 2,
Please delete "ON SEMICONDUCTOR DEVICES" after "METHOD OF DEPOSITING FILMS".

Title page,
Item [56], References Cited, OTHER PUBLICATIONS, J.M. Klerks et al. reference, please delete "AL(CH$_3$)$_3$" and insert -- Al(CH$_3$)$_3$ --;delete "(CH$_3$)$_2$ALR" and insert -- (CH$_3$)$_2$AlR --; delete "(CH$_3$)$_2$ALR" and insert -- (CH$_3$)$_2$AlR -- therefor.

Column 1,
Line 40, please insert -- of -- after "directed to a method".
Line 41, please delete "of" that occurs after "preferably".
Line 60, please delete "(OC(O)R$_1$)" and insert -- (OC(O)R$^1$) --therefor.

Column 2,
Line 51, please delete "meta" and insert -- metal -- therefor.

Column 3,
Line 9, please delete "nitrites" and insert -- nitriles -- therefor.

Column 4,
Line 2, please delete "(OC(O)R$_1$)" and insert -- (OC(O)R$^1$) --therefor.
Line 3, please delete "(OC(O)R$_1$)" and insert -- (OC(O)R$^1$) --therefor.

Column 11,
Line 13, please delete "1a1"and insert -- H -- therefor.

UNITED STATES PATENT AND TRADEMARK OFFICE
CERTIFICATE OF CORRECTION

PATENT NO.    : 6,010,969
DATED         : January 4, 2000
INVENTOR(S)   : Brian A. Vaartstra It is certified that error appears in the above-identified patent and that said Letters Patent is hereby corrected as shown below:

Column 14,
Line 35, please delete "$M^{n+}(OC(O)R^1)_u(O)_v\{(R^3)(R^4)N[CH_2]_xN(R^5)]_x(CH_2)_yN$" and insert -- $M^{n+}(OC(O)R^1)_u(O)_v\{(R^3)(R^4)N[CH_2]_wN(R^5)]_x(CH_2)_yN$ -- therefor.

Signed and Sealed this

Thirtieth Day of July, 2002

Attest:

JAMES E. ROGAN
Attesting Officer   Director of the United States Patent and Trademark Office